United States Patent
Liu et al.

(10) Patent No.: US 6,211,024 B1
(45) Date of Patent: Apr. 3, 2001

(54) METHOD FOR FORMING A SEMICONDUCTOR DEVICE BY USING MULTIPLE ION IMPLANTATION SEQUENCE TO REDUCE CRYSTAL DEFECTS AND TO ALLOW THE REDUCTION OF THE TEMPERATURE USED FOR A SUBSEQUENT RAPID THERMAL ANNEAL PROCEDURE

(75) Inventors: Chi-Wen Liu; Kou-Yu Chou, both of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/495,345

(22) Filed: Feb. 1, 2000

(51) Int. Cl.[7] .................................... H01L 21/336
(52) U.S. Cl. .................... 438/299; 438/303; 438/305; 438/307; 438/595
(58) Field of Search .................... 438/299, 301, 438/303, 305, 306, 307, 595

(56) References Cited

U.S. PATENT DOCUMENTS

| | | | |
|---|---|---|---|
| 5,155,369 | 10/1992 | Current | 250/492.2 |
| 5,719,424 | 2/1998 | Ahmad et al. | 257/336 |
| 5,793,090 | 8/1998 | Gardner et al. | 257/408 |
| 5,998,274 | * 12/1999 | Akram et al. | 438/306 |
| 6,096,616 | * 12/1999 | Nistler et al. | 438/305 |

\* cited by examiner

*Primary Examiner*—Chandra Chaudhari
*Assistant Examiner*—Jack Chen
(74) *Attorney, Agent, or Firm*—George O. Saile; Stephen B. Ackerman

(57) ABSTRACT

A process for forming a shallow source/drain region, for a sub-micron MOSFET device, has been developed. The process features a process sequence comprised of a series of ion implantation procedures, followed by a low temperature, rapid thermal anneal procedure. Each ion implantation procedure, uses a specific energy and a specific dose, resulting in a series of ion implant regions, each located at a specific depth in the semiconductor substrate. A rapid thermal anneal is used to activate the implanted ions, forming the shallow source/drain region. The creation of several ion implant regions, reduced the risk of crystal damage which can result with the use of a single, more concentrated, ion implant region. The risk of crystal damage is also reduced via the use of a rapid thermal anneal procedure, which can be employed at lower temperatures than counterpart anneal procedures, that are used to distribute ions from a single, ion implanted region.

17 Claims, 2 Drawing Sheets

METHOD FOR FORMING A SEMICONDUCTOR DEVICE BY USING MULTIPLE ION IMPLANTATION SEQUENCE TO REDUCE CRYSTAL DEFECTS AND TO ALLOW THE REDUCTION OF THE TEMPERATURE USED FOR A SUBSEQUENT RAPID THERMAL ANNEAL PROCEDURE

BACKGROUND OF THE INVENTION (1) Field of the Invention

The present invention relates to methods used to fabricate semiconductor devices, and more specifically to a method used to form source/drain regions, for metal oxide semiconductor field effect, (MOSFET), devices, via ion implantation and rapid thermal anneal, (RTA), procedures.

(2) Description of Prior Art

The use of sub-micron MOSFET devices, for logic as well as memory applications, has focused attention on the methods used to form shallow MOSFET source/drain regions. Conventional ion implantation procedures have been used to place a specific dose of implanted species, at a specific location in the region of a semiconductor substrate used for the source/drain regions. A high temperature anneal procedure is then used to distribute the implanted ions, resulting in the desired source/drain region. These procedures however, when used for sub-micron MOSFET devices, (or devices with channel lengths less than 0.25 um), can result in undesired source/drain—substrate leakages, due to crystal defects in the semiconductor substrate. The crystal defects can result from a high, source/drain, ion implantation dose, concentrated at one specific region in the semiconductor substrate. In addition a subsequent anneal procedure, used to activate the implanted species, has to be performed at a temperature high enough to distribute the implanted species, from the specific implanted location in the substrate, throughout the source/drain region. This high temperature anneal procedure results in unwanted dopant movement, at other locations in the MOSFET device, as well as aggravating the crystal defect formation.

This invention will describe a combination of processes, comprised of a novel ion implantation procedure, followed by a low temperature RTA procedure, used to create shallow source/drain regions, for sub-micron MOSFET devices. The ion implantation procedure features the use of a sequence of ion implantation steps, each performed at a specific energy and a specific dose, thus avoiding the placement of one large implanted dose, in one location of the subsequent source/drain region, reducing the risk of crystal damage. The placement of implanted species in several locations of the subsequent shallow source/drain region, relaxes the RTA temperature needed for distribution of the implanted species, also reducing the risk of crystal defect formation. Prior art, such as Gardner et al, in U.S. Pat. No. 5,793,090, describe a sequence of ion implantation steps used to form a source/drain region, however that prior art does not feature the unique combination of implant doses, or the use of a low temperature anneal procedure, used in this present invention.

SUMMARY OF THE INVENTION

It is an object of this invention to form a shallow source/drain region, for a sub-micron MOSFET device, via ion implantation and RTA procedures.

It is another object of this invention to use a sequence of ion implantation steps, to place implanted species at specific locations of a subsequent source/drain region, with the highest concentration of implanted species initially implanted deeper in the source/drain region than the lowest concentration of implanted species.

It is still another object of this invention to use a RTA procedure, performed at a reduced temperature, to uniformly distribute the ion implanted species, resulting in a uniform dopant concentration for the shallow source/drain region, without crystal defect formation.

In accordance with the present invention a method of forming a shallow source/drain region for a sub-micron, MOSFET device, featuring the use of a sequence of ion implantation steps, each performed at a specific energy and a specific dose, and featuring a low temperature RTA procedure, used to uniformly distribute the ion implanted species, has been developed. After creation of a gate structure, on an underlying gate insulator layer, a lightly doped source/drain region is formed in a region of the semiconductor substrate, not covered by the gate structure, followed by the formation of insulator spacers on the sides of the gate structure. A sequence of ion implantation procedures is next performed, placing specific concentrations of implanted ions at specific depths, in a region of the semiconductor substrate not covered by the gate structure, or by the insulator spacers. The sequence of ion implantation procedures is comprised of a first ion implantation procedure, placing a first concentration of ion implanted species in a region of the semiconductor substrate; a second ion implantation procedure, placed shallower in the semiconductor substrate than the first ion implantation procedure, and featuring a second concentration of ions, lower in ion concentration than the first ion implantation concentration; and a third ion implantation procedure, placed closest to the surface of the semiconductor substrate, featuring a third concentration of ion implantation species, lower in concentration than the second concentration of ion implanted species. A low temperature, RTA procedure is then employed to distribute the implanted species, resulting in a uniformly doped, shallow source/drain region.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a shallow source/drain region, for a sub-micron MOSFET device, featuring the use of a combination of process steps, comprised of a sequence of ion implantation procedures, each performed at a unique implant energy and dose, and a comprised of a subsequent low temperature RTA procedure, enabling a shallow source/drain region with uniform dopant concentration, and with reduced risk of crystal damage, to be achieved, will now be described in detail. This invention will be described for an N channel type, MOSFET device, thus using N type source/drain regions. However if desired this invention can also be used to form P type, source/drain regions, for P channel MOSFET devices.

Figure 1:
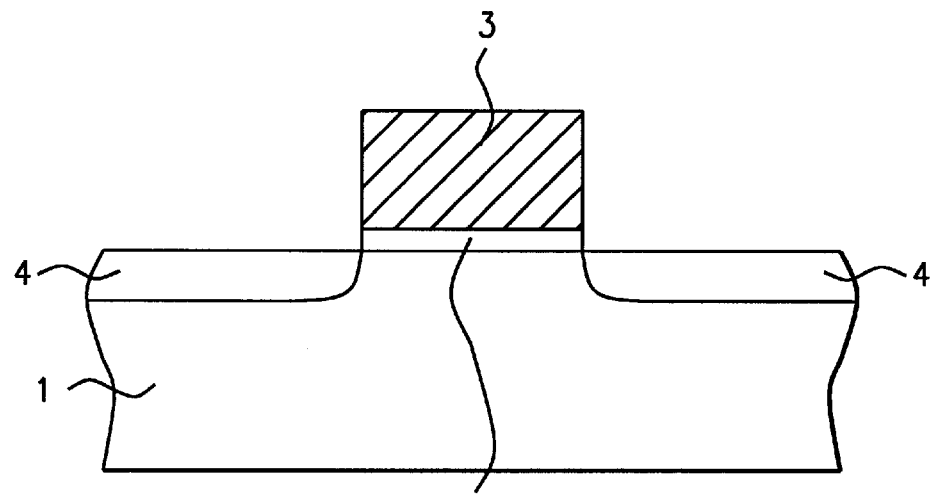
FIGS. 1–5, which schematically, in cross-sectional style, show key stages of fabrication used to create a shallow source/drain region, for a sub-micron MOSFET device.

A P type, semiconductor substrate 1, comprised of single crystalline silicon, with a <100> crystallographic orientation, is used and schematically shown in FIG. 1. A gate insulator layer 2, comprised of silicon dioxide, at a thickness between about 50 to 200 Angstroms, is thermally grown in an oxygen—steam ambient, at a temperature between about 850 to 950° C. A polysilicon layer is next deposited via low pressure chemical vapor deposition, (LPCVD), procedures, to a thickness between about 1000 to 3000 Angstroms. The polysilicon layer can be in situ doped, during deposition, via the addition of arsine, or phosphine, to a silane ambient, or the polysilicon layer can be deposited intrinsically then doped via ion implantation of arsenic or phosphorous ions. Conventional photolithographic and reactive ion etching, (RIE), procedures, are used to define gate structure 3, schematically shown in Fig . 3. If lower word line resistance is desired, gate structure 3, can be a polycide, (metal silicide—polysilicon), structure, comprised of an underlying polysilicon component, and an overlying metal silicide component, such as tungsten silicide. The metal silicide component, as well as the underlying polysilicon component, can be obtained via LPCVD procedures, and defined via photolithographic and RIE procedures. After removal of the photoresist shape, used for definition of gate structure 3, via plasma oxygen ashing and careful wet cleans, lightly doped source/drain region 4, schematically shown in FIG. 1, is formed via ion implantation of arsenic or phosphorous ions, in a region of semiconductor substrate 1, not covered by gate structure 3. Lightly doped source/drain region 4, is formed using a implant energy between about 10 to 60 KeV, and an implant dose between about 1E12 to 1E14 atoms/cm$^2$.

Figure 2:
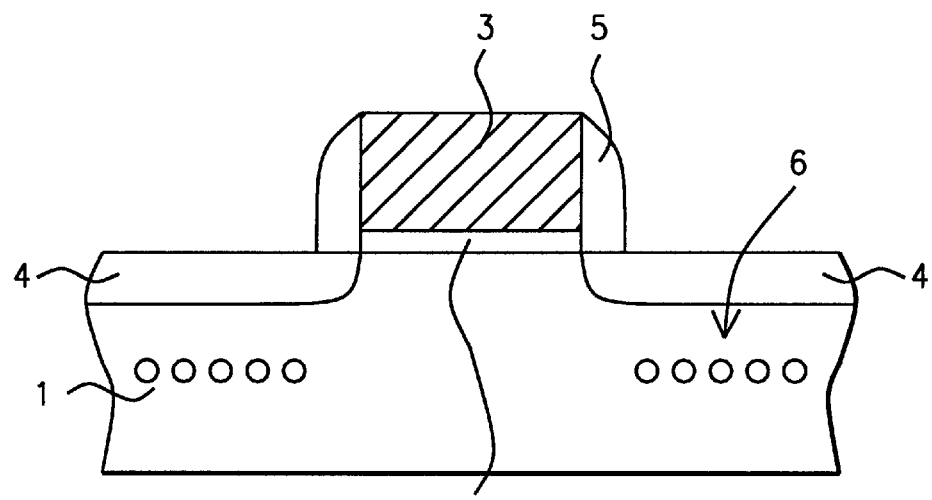

Insulator spacers 5, comprised of either silicon oxide or silicon nitride, shown schematically in FIG. 2, are next formed on the sides of gate structure 3. This is accomplished via deposition of either silicon oxide, or silicon nitride, via LPCVD or via plasma enhanced chemical vapor deposition, (PECVD), procedures, to a thickness between about 1000 to 3000 Angstroms. A blanket RIE procedure, using CHF$_3$ or CF$_4$ as an etchant, is used to form insulator spacers 5, on the sides of gate structure 3. The first phase of a sequence of ion implantation procedures, used to form the shallow source/drain region, of a sub-micron MOSFET device, is next addressed. This is accomplished via ion implantation of arsenic, or phosphorous ions, at an energy between about 35 to 45 KeV, at a dose between about 5E14 to 5E15 atoms/cm$^2$. The first concentration, or first region of N type ions 6, is located between about 250 to 500 Angstroms below the top surface of semiconductor substrate 1. This is schematically shown in FIG. 2.

Figure 3:
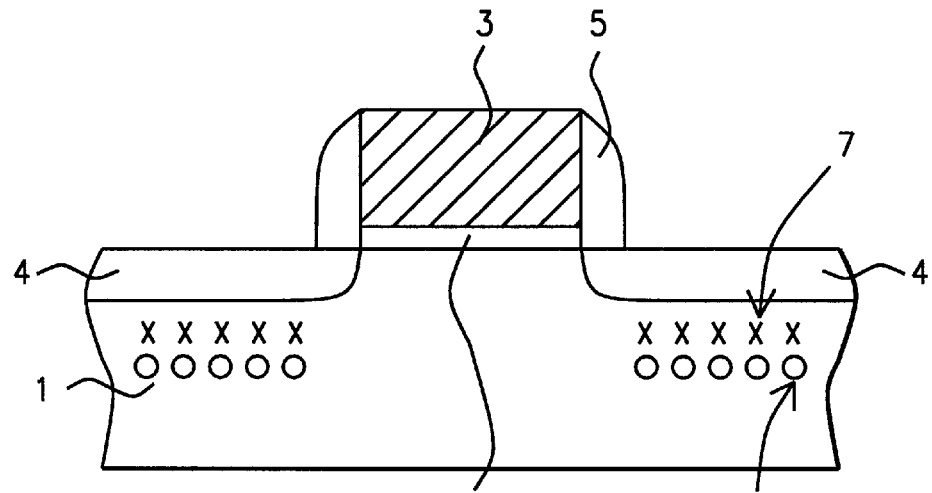
Figure 4:
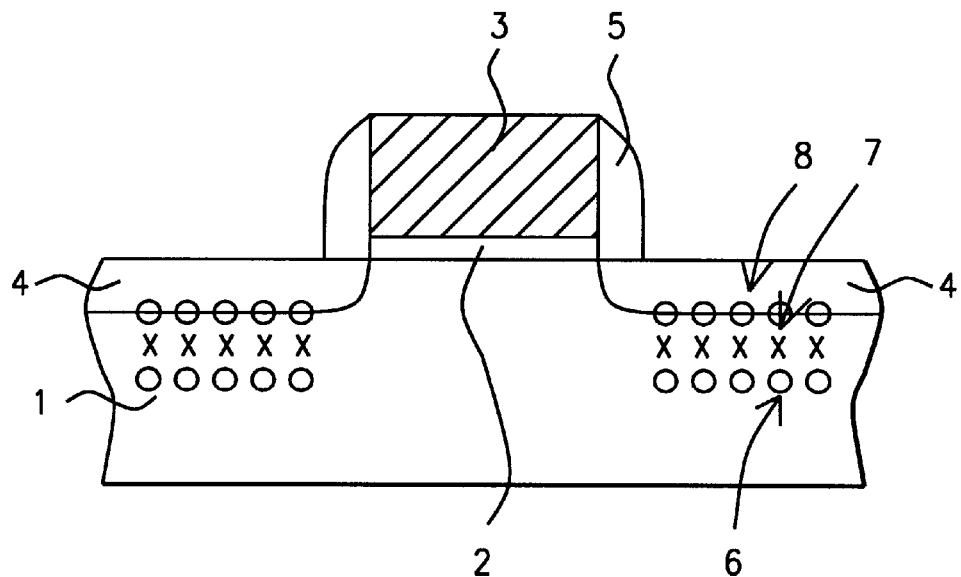

A second phase of the sequence of ion implantation procedures, used to form the desired, damage free, shallow source/drain region, is next addressed via ion implantation of arsenic or phosphorous ions, at an energy between about 15 to 25 KeV, using a dose between about 5E13 to 5E14 atoms/cm$^2$. The second concentration, or second region of N type ions 7, schematically shown in FIG. 3, is located between about 160 to 250 Angstroms below the top surface of semiconductor substrate 1. The third phase of this sequence of ion implantation procedures is then performed, again using arsenic or phosphorous ions, at an energy between about 5 to 15 KeV, and at a dose between about 5E12 to 5E13 atoms/cm$^2$. The third concentration, or third region of N type ions 8, schematically shown in FIG. 4, is located between about 100 to 150 Angstroms, below the top surface of semiconductor substrate 1.

Figure 5:
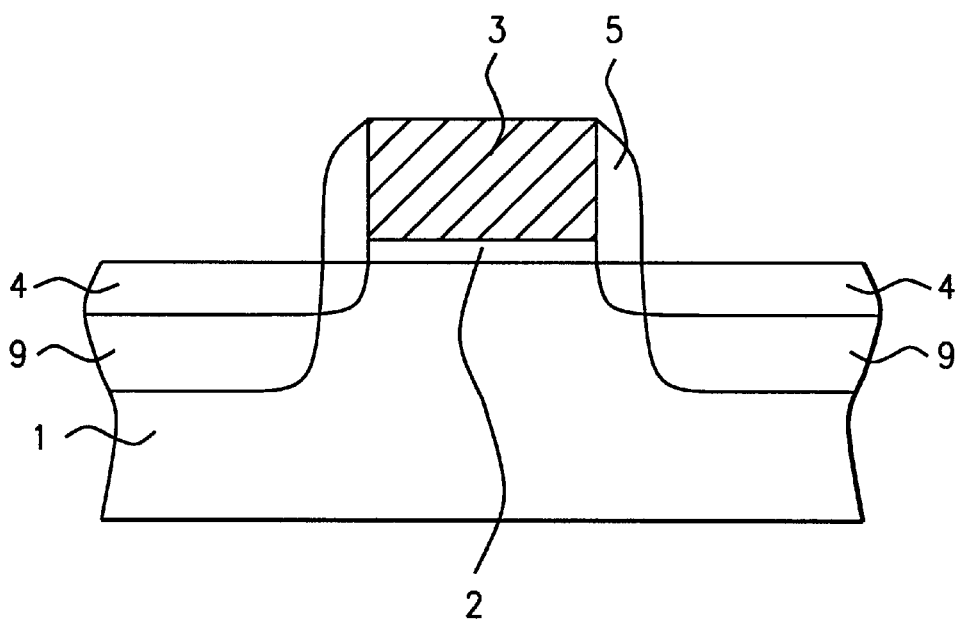

Activation of the implanted species, in first region 6, in second region 7, and in third region 8, as well as the distribution, or diffusion of these dopants, needed to obtain a uniformly doped, shallow source/drain region, is next addressed. A rapid thermal anneal, (RTA), procedure, is performed at a temperature between about 950 to 1000° C., in a nitrogen ambient, for a time between about 15 to 25 sec, resulting in shallow source/drain region 9, schematically shown in FIG. 5. The use of the multiple regions of ions, allowed the temperature of the RTA procedure to be lower than RTA temperatures used when attempting to distribute ions from only a single region of implanted ions. The lower anneal temperature, and the absence of a large ion concentration, present when only a single, more heavily concentrated, region of ions is used, prevented deleterious crystal damage, and unwanted leakage currents, from occurring.

As previously mentioned, this invention can also be applied to P channel MOSFET devices, using a sequence of ion implantation procedures, featuring the use of either boron, or BF$_2$ ions, creating regions of P type ions, each at a specific depth in the semiconductor substrate, and each with a specific ion concentration. In addition, although this invention has been described featuring three specific ion implant regions, the number of specific ion implant regions can be decreased to two, or increased from three, if desired.

While this invention has been particularly shown and described with reference to, the preferred embodiments thereof, it will be understood by those skilled in the art that various changes in form and details may be made without departing from the spirit and scope of this invention.

What is claimed is:

1. A method of forming a source/drain region, in a semiconductor substrate, comprising the steps of:

providing a gate structure, on an underlying gate insulator layer, on said semiconductor substrate;

providing a lightly doped source/drain region, in a region of said semiconductor substrate, not covered by said gate structure;

providing insulator spacers on sides of said gate structure;

performing a first ion implantation procedure, creating a first ion implant region, with a first concentration and first energy of ion implanted species, located in a first region of said semiconductor substrate, not covered by said gate structure, or by said insulator spacers;

performing a second ion implantation procedure, creating a second ion implant region, with a second concentration and second energy of ion implanted species, located in a second region of said semiconductor substrate, not covered by said gate structure, or by said insulator spacers, wherein the second concentration and the second energy are lower than said first concentration and said first energy respectively;

performing a third ion implantation procedure, creating a third ion implant region, with a third concentration and third energy of ion implanted species, located in a third region of said semiconductor substrate, not covered by said gate structure, or by said insulator spacers, wherein the third concentration and the third energy are lower than said second concentration and said second energy respectively; and performing an anneal procedure, activating, and distributing ion implant species of said first ion implant region, of said second ion implant region, and of said third ion implant region, forming said source/drain region.

2. The method of claim 1, wherein said first ion implantation procedure is performed using arsenic or phosphorous ions, at an energy between about 35 to 45 KeV, at a dose between about 5E14 to 5E15 atoms/cm$^2$.

3. The method of claim 1, wherein said first ion implant region is located between about 250 to 500 Angstroms below a top surface of said semiconductor substrate.

4. The method of claim 1, wherein said second ion implantation procedure is performed using arsenic or phosphorous ions, at an energy between about 15 to 25 KeV, at a dose between about 5E13 to 5E14 atoms/cm$^2$.

5. The method of claim 1, wherein said second ion implant region is located between about 160 to 250 Angstroms below a top surface of said semiconductor substrate.

6. The method of claim 1, wherein said third ion implantation procedure is performed using arsenic or phosphorous ions, at an energy between about 5 to 15 KeV, at a dose between about 5E12 to 5E13 atoms/cm$^2$.

7. The method of claim 1, wherein said third ion implant region is located between about 100 to 150 Angstroms below a top surface of said semiconductor substrate.

8. The method of claim 1, wherein said anneal procedure, is a rapid thermal anneal procedure, performed at a temperature between about 950 to 1000° C., in a nitrogen ambient, for a time between about 15 to 25 sec.

9. A method of forming a shallow source/drain region, in a semiconductor substrate, via a combination of process steps comprised of a sequence of ion implantation procedures, and of a low temperature anneal procedure, comprising the steps of:

providing a gate structure, on an underlying gate insulator layer, with a lightly doped source/drain region located in a region of said semiconductor substrate, not covered by said gate structure, and with insulator spacers located on said gate structure;

performing a first ion implantation procedure, creating a first ion implant region, with a first concentration and first energy of ion implanted species, located in a first region of said semiconductor substrate, not covered by said gate structure, or by insulator spacers;

performing a second ion implantation procedure, creating a second ion implant region, with a second concentration and second energy of ion implanted species, with said second ion implant region lower in implanted ion concentration and energy than said first ion implant region, and with said second ion implant region located in a second region of said semiconductor substrate, located closer to a top surface of said semiconductor substrate than said first ion implant region;

performing a third ion implantation procedure, creating a third ion implant region, with a third concentration and third energy of ion implanted species, with said third ion implant region lower in implanted ion concentration and energy than said second ion implant region, and with said third ion implant region located in a third region of said semiconductor substrate, closer to the top surface of said semiconductor substrate, than said second ion implant region; and performing said low temperature anneal procedure, activating implanted ions in said first ion implant region, in said second ion implant region, and in said third ion implant region, and forming said shallow source/drain region.

10. The method of claim 9, wherein a number of ion implantation procedures, included in said sequence of ion implant procedures, and a number of ion implant regions formed, are two or more.

11. The method of claim 9, wherein said first ion implantation procedure is performed using arsenic or phosphorous ions, at an energy between about 35 to 45 KeV, at a dose between about 5E14 to 5E15 atoms/cm$^2$.

12. The method of claim 9, wherein said first ion implant region is located between about 250 to 500 Angstroms below the top surface of said semiconductor substrate.

13. The method of claim 9, wherein said second ion implantation procedure is performed using arsenic or phosphorous ions, at an energy between about 15 to 25 KeV, at a dose between about 5E13 to 5E14 atoms/cm$^2$.

14. The method of claim 9, wherein said second ion implant region is located between about 160 to 250 Angstroms below the top surface of said semiconductor substrate.

15. The method of claim 9, wherein said third ion implantation procedure is performed using arsenic or phosphorous ions, at an energy between about 5 to 15 KeV, at a dose between about 5E12 to 5E13 atoms/cm$^2$.

16. The method of claim 9, wherein said third ion implant region is located between about 100 to 150 Angstroms below the top surface of said semiconductor substrate.

17. The method of claim 9, wherein said low temperature anneal procedure, is performed using a rapid thermal anneal procedure, at a temperature between about 950 to 1000° C., in a nitrogen ambient, for a time between about 15 to 25 sec.

* * * * *